(12) United States Patent
Mayell (10) Patent No.: US 10,819,102 B2
(45) Date of Patent: Oct. 27, 2020

(54) ELECTRONIC CIRCUIT FOR FAST TEMPERATURE SENSING OF A POWER SWITCHING DEVICE

(71) Applicant: Power Integrations, Inc., San Jose, CA (US)

(72) Inventor: Robert Mayell, Los Altos, CA (US)

(73) Assignee: Power Integrations, Inc., San Jose, CA (US)

(*) Notice: Subject to any disclaimer, the term of this patent is extended or adjusted under 35 U.S.C. 154(b) by 421 days.

(21) Appl. No.: 15/863,182

(22) Filed: Jan. 5, 2018

(65) Prior Publication Data

US 2018/0175610 A1 Jun. 21, 2018

Related U.S. Application Data (63) Continuation-in-part of application No. PCT/US2016/046071, filed on Aug. 8, 2016.

(51) Int. Cl.
*H02H 5/04* (2006.01)
*H01L 23/24* (2006.01)
(Continued)

(52) U.S. Cl.
CPC ............ *H02H 5/044* (2013.01); *G01K 3/005* (2013.01); *G01K 7/01* (2013.01); *H01L 23/34* (2013.01);
(Continued)

(58) Field of Classification Search
CPC ...... G01K 2217/00; G01K 3/005; G01K 7/01; H01L 23/34; H01L 27/0266;
(Continued)

(56) References Cited

U.S. PATENT DOCUMENTS

| 4,553,084 A | 11/1985 | Wrathall |
| 4,951,102 A | 8/1990 | Beitman |

(Continued)

FOREIGN PATENT DOCUMENTS

| JP | S062114459 | 5/1987 |
| JP | H06045602 | 2/1994 |

(Continued)

OTHER PUBLICATIONS

Nui et al. "Sensing Power MOSFET Junction Temperature Using Gate Drive Turn-On Current Transient Properties", IEEE, Sep. 14, 2014, pp. 2909-2916.

*Primary Examiner* — Jared Fureman
*Assistant Examiner* — Nicolas Bellido
(74) *Attorney, Agent, or Firm* — The Law Offices of Bradley J. Bereznak (57) ABSTRACT

An electronic circuit for sensing a temperature rise in a power transistor device, the temperature rise caused by a current flow in the power transistor device. The power transistor device and a sense-FET are disposed on a substrate. The sense-FET senses a fractional portion of the current flow and outputs a current signal. A JFET has its drain connected to the drain of the power transistor device. The gate of the JFET is connected to the source of the power transistor device, such that when the power transistor device is on, the JFET is also turned on, and a drain voltage signal of the power transistor device is output at a second node of the JFET. A detection circuit receives the drain voltage signal and the current signal and outputs an alarm signal when the drain-source resistance of the power transistor device exceeds a combined threshold limit.

28 Claims, 6 Drawing Sheets

(51) Int. Cl.

| | | |
|---|---|---|
| *H01L 27/02* | (2006.01) | |
| *H02H 1/00* | (2006.01) | |
| *H01L 23/34* | (2006.01) | |
| *G01K 7/01* | (2006.01) | |
| *G01K 3/00* | (2006.01) | |
| *H03K 17/18* | (2006.01) | |
| *H03K 17/082* | (2006.01) | |
| *H01L 29/20* | (2006.01) | |
| *H01L 49/02* | (2006.01) | |
| *H01L 29/16* | (2006.01) | |
| *H01L 29/78* | (2006.01) | |
| *H01L 29/808* | (2006.01) | |
| *H01L 27/06* | (2006.01) | |
| *H01L 29/778* | (2006.01) | |
| *H03K 17/08* | (2006.01) | |

(52) U.S. Cl.
CPC ....... *H01L 27/0266* (2013.01); *H02H 1/0007* (2013.01); *H03K 17/0822* (2013.01); *H03K 17/18* (2013.01); *G01K 2217/00* (2013.01); *H01L 27/0629* (2013.01); *H01L 28/20* (2013.01); *H01L 29/16* (2013.01); *H01L 29/2003* (2013.01); *H01L 29/778* (2013.01); *H01L 29/78* (2013.01); *H01L 29/808* (2013.01); *H03K 2017/0806* (2013.01); *H03K 2217/0027* (2013.01)

(58) Field of Classification Search
CPC ..... H01L 27/0629; H01L 28/20; H01L 29/16; H01L 29/2003; H01L 29/778; H01L 29/78; H01L 29/808; H02H 1/0007; H02H 3/08; H02H 5/044; H03K 17/0822; H03K 17/18; H03K 2017/0806; H03K 2217/0027

See application file for complete search history.

(56) References Cited

U.S. PATENT DOCUMENTS

| | | | |
|---|---|---|---|
| 5,821,580 | A | 10/1998 | Kuwahara |
| 6,323,703 | B1 | 11/2001 | Fotouhi |
| 6,573,558 | B2 | 6/2003 | Disney |
| 7,554,152 | B1 | 6/2009 | Ranucci et al. |
| 8,022,456 | B2 | 9/2011 | Parthasarathy |
| 8,687,332 | B2 * | 4/2014 | Yu .......... H05B 45/50 361/79 |
| 8,941,963 | B2 * | 1/2015 | Souma ........ H02H 3/08 361/93.1 |
| 2002/0093366 | A1 | 7/2002 | Fotouhi |
| 2004/0227545 | A1 | 11/2004 | Nadd et al. |
| 2005/0167742 | A1 | 8/2005 | Challa |
| 2005/0167749 | A1 | 8/2005 | Disney |
| 2005/0218963 | A1 | 10/2005 | Ball |
| 2008/0197396 | A1 | 8/2008 | Parthasarathy |
| 2008/0197397 | A1 | 8/2008 | Parthasarathy et al. |
| 2008/0197406 | A1 | 8/2008 | Parthasarathy et al. |
| 2011/0248702 | A1 | 10/2011 | Kume |
| 2013/0332750 | A1 | 12/2013 | Souma |
| 2014/0070313 | A1 | 3/2014 | Wang et al. |
| 2015/0309524 | A1 | 10/2015 | Levhar et al. |
| 2016/0013765 | A1 | 1/2016 | Vincenzo |
| 2016/0056138 | A1 | 2/2016 | Shabib |
| 2016/0084887 | A1 | 3/2016 | Beer et al. |
| 2016/0133620 | A1 | 5/2016 | Pedone et al. |
| 2016/0178450 | A1 | 6/2016 | Trifonov |
| 2016/0344220 | A1 | 11/2016 | Liu |
| 2017/0170090 | A1 | 6/2017 | Ko |
| 2018/0149526 | A1 | 5/2018 | Abughazaleh et al. |

FOREIGN PATENT DOCUMENTS

| | | |
|---|---|---|
| JP | H06334189 | 12/1994 |
| JP | H08139200 | 5/1996 |
| JP | H09213926 | 8/1997 |
| JP | H10256541 | 9/1998 |
| JP | 2008283498 | 11/2008 |
| JP | 2009081381 | 4/2009 |
| JP | 2009278802 | 11/2009 |
| JP | 2013255117 | 12/2013 |

* cited by examiner

ELECTRONIC CIRCUIT FOR FAST TEMPERATURE SENSING OF A POWER SWITCHING DEVICE

RELATED APPLICATIONS

The present application is a continuation-in-part (CIP) application of PCT Patent Application PCT/US16/46071, filed Aug. 8, 2016 entitled, "Integrated Circuit for Fast Temperature Sensing of a Semiconductor Switching Device", the entirety of which is hereby incorporated by reference.

TECHNICAL FIELD

This application relates generally to circuits for detecting temperature in semiconductor devices; more specifically, to circuitry for sensing temperature changes in a power MOSFET integrated circuit.

BACKGROUND

For the protection of power semiconductor switching devices, it is important to quickly detect temperature increases directly inside the switch (junction temperature) and not rely upon controller temperature measurements. For instance, if the power switch (MOSFET) and controller are on different semiconductor dies, there may be long delay of heat transfer and thermal equilibrium between the power switch and the controller. This could cause a catastrophic failure of the power MOSFET before any reaction from the controller protection circuitry.

Past approaches for sensing temperature include sensing the temperature on a heat sink attached to the power switching device. Another known method for temperature sensing is through an electrically-isolated polysilicon diode located in close proximity of to the power MOSFET junction. The forward voltage drop of the sense diode has a negative temperature coefficient such that the forward voltage drop is inversely proportional to the MOSFET junction temperature. Another past approach relies upon a voltage-variable resistor that exhibits a linear variation of resistance with temperature.

In one type of power MOSFET technology, the semiconductor substrate is typically referenced to the drain potential. This is the major thermal connection of the device. Controllers used with the MOSFET are normally low-side connected controllers, and, as such, their reference voltage is shared with the source potential of the MOSFET. Since the source potential of the MOSFET is not the major thermal connection to the device, it is difficult to get a good thermal coupling to the device by sharing a source connection. In one prior approach, in an example of a half-bridge switching configuration, the thermal connection is obtained via the high-side driver, which itself is referenced to the source of the high-side MOSFET, which is also the drain of the low-side MOSFET. Thus, the high-side driver can achieve a reasonably good thermal connection to the drain of the low-side MOSFET and, as such monitor the low-side MOSFET temperature.

The aforementioned configuration has two major drawbacks. First, thermal detection is taken on the floating high-side driver, and thus, the only option for the high-side driver is a latching shutdown when the thermal threshold is exceeded. Secondly while the thermal coupling from the low-side MOSFET to the high-side driver is acceptable for steady-state and slowly changing temperatures, when there is a sudden, rapid and large temperature change on the power MOSFET, thermal coupling is insufficient to quickly follow the change in temperature. As such, under transient conditions it is easy to exceed intended maximum temperatures on the power MOSFET prior to the high-side driver detecting the problem.

Another drawback is that under certain circumstances the customer would like to have a hysteretic thermal shutdown capability. However, this is not possible when there is no communicating signal from the low-side controller to the thermal detection circuit.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the disclosed devices. Also, common but well-understood elements that are useful or necessary in a commercially feasible embodiment are often not depicted in order to facilitate a less obstructed view of these various embodiments disclosed.

DETAILED DESCRIPTION

In the following description specific details are set forth, such as device types, voltages, component values, circuit configurations, etc., in order to provide a thorough understanding of the embodiments described. However, persons having ordinary skill in the relevant arts will appreciate that these specific details may not be needed to practice the embodiments described. It is further appreciated that well known circuit structures and elements have not been described in detail, or have been shown in block diagram form, in order to avoid obscuring the embodiments described.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art.

For purposes of this disclosure, "ground" or "ground potential" refers to a reference voltage or potential against which all other voltages or potentials of an electronic circuit or Integrated circuit (IC) are defined or measured.

In the context of the present application, when a transistor is in an "off state" or "off" the transistor does not substantially conduct current. Conversely, when a transistor is in an "on state" or "on" the transistor is able to substantially conduct current. By way of example, a power transistor may comprise an N-channel metal-oxide-semiconductor field-effect transistor (NMOS) with a high voltage being supported between the first terminal, a drain, and the second terminal, a source. The power MOSFET may comprise a power switch that is driven by an integrated controller circuit to regulate energy provided to a load.

In one embodiment, an apparatus and method for detecting the temperature of semiconductor switching devices such as controlled switches or diodes (e.g. Schottky diodes) is provided. Although specific examples shown and described below include a MOSFET switching device, it is appreciated that other switching devices may be utilized in accordance with the teachings of this disclosure.

In one example a power MOSFET switching device has a substrate referenced to the drain potential, with the drain being the major thermal connection of the device. A controller to control switching of the device may be a low-side connected controller and as such its reference voltage is shared with the source potential of the vertical power MOSFET switching device. The controller may be integrated together in the same integrated circuit die as the power MOSFET switching device, or it may be separated into a different integrated circuit die. The power MOSFET switching device and controller may be included in the same package, or housed in separate packages.

In one embodiment, an apparatus and method of detecting temperature in a power semiconductor switching device via a low-side connected circuit is provided. Temperature detection occurs directly using electrical signals measured on the power semiconductor switching device (e.g., MOSFET) rather than indirect die-to-die thermal coupling. As a result, this allows for instantaneous thermal detection and thus protects against transient conditions where there is fast transient temperature rise. Additionally, the low-side reference provides the capability of hysteretic thermal shutdown features.

Figure 1A:
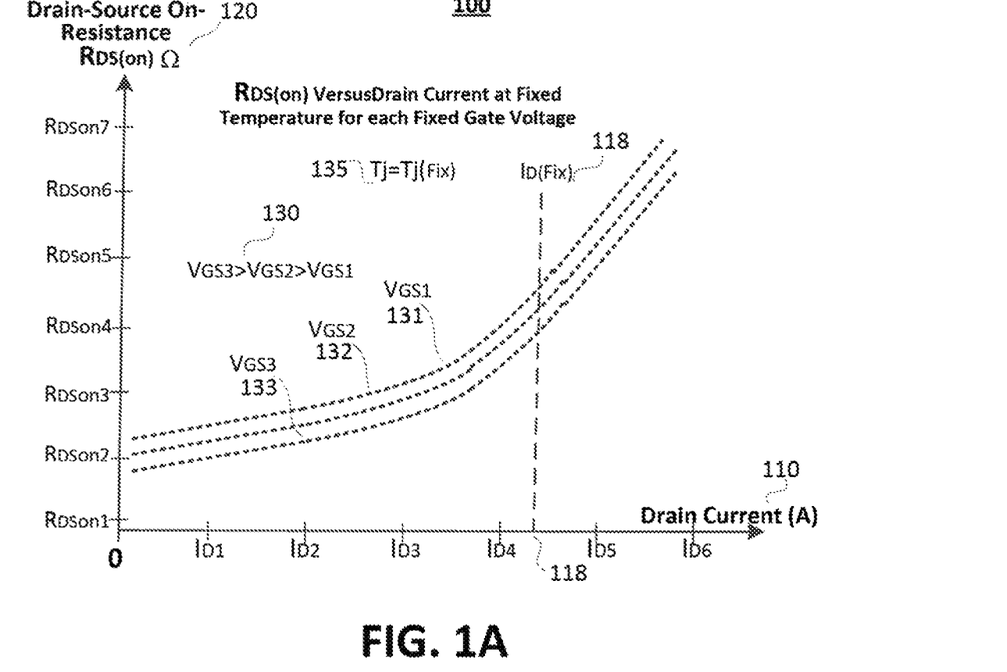
FIGS. 1A and 1B are graphs of an example vertical MOSFET illustrating the variation of drain-to-source on-resistance, $R_{DS(on)}$, with respect to drain current ($I_D$) and junction temperature ($T_j$).
Figure 1B:
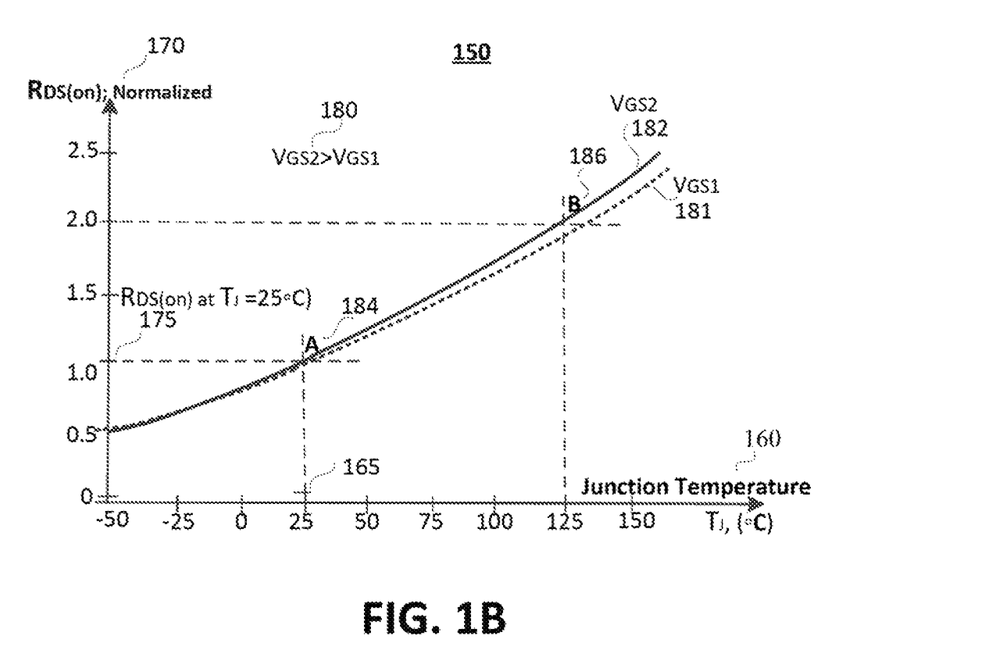

FIG. 1A is a general graph for a semiconductor switching device (in one example MOSFET) illustrating the variation of drain-to-source on-resistance, $R_{DS(on)}$, with respect to drain current in a fixed junction temperature ($T_j$) and for different gate to source voltage values as a parameter. FIG. 1B shows the graph of drain-to-source normalized on-resistance $R_{DS(on)}$ versus junction temperature ($T_j$). In a typical MOSFET the measured $R_{DS(on)}$ may include the channel, the accumulation layer of the formed JFET and parasitic effects from metallization, bond wires and packaging. In a high-voltage power MOSFET the resistance of channel/drift region dominates the $R_{DS(on)}$.

In graphs 100 of FIG. 1A the $R_{DS(on)}$ variation (e.g. $R_{DS(on)1}$, $R_{DS(on)2}$, $R_{DS(on)3}$, ... in Ohm) is demonstrated on vertical axis 120 versus the drain current (e.g. $I_{D1}$, $I_{D2}$, $I_{D3}$, ... in Ampere) on horizontal axis 110. In a numerical example for different MOSFET types this graph may show around 10% direct effect of drain current $I_D$ on $R_{DS(on)}$ for a drain current range up to 100 A. The graphs 100 in FIG. 1A are illustrated for different examples of gate-source voltages $V_{GS1}$ 131, $V_{GS2}$ 132 and $V_{GS3}$ 133, wherein expression 130 defines $V_{GS3} > V_{GS2} > V_{GS1}$ and graphs are for a fixed junction temperature $T_{j(Fix)}$ 135. The vertical line $I_{D(Fix)}$ 134, presents a fixed drain threshold current that may be used to measure the drain-source on-resistance, $R_{DS(on)}$ for the changes with temperature.

On the other hand, in graphs 150 of FIG. 1B the normalized values of $R_{DS(on)}$ on vertical axis 170 show a strong relation versus junction temperature $T_j$ (e.g. in degrees centigrade, ° C.) on horizontal axis 160 varying from −50° C. to 150° C. Two example graphs are introduced for Gate-Source voltages $V_{GS1}$ 181 and $V_{GS2}$ 182 wherein expression 180 defines $V_{GS2} > V_{GS1}$. The normalized value ($R_{DS(on)}=1$) 175 defines the switching device drain-source on-resistance at the reference temperature ($T_j=25°$ C.) 165. As can be observed in FIG. 1B the $R_{DS(on)}$ almost doubles for temperature rise from $T_j=25°$ C. to $T_j=125°$ C. from point A 184 to point B 186 measured on graph of $V_{GS2}$ 182. The temperature coefficient of $R_{DS(on)}$ is the slope of the curve in graphs of FIG. 1B which is always positive because of the majority-only carriers. The positive $R_{DS(on)}$ temperature coefficient may compound the conduction loss as temperature rises. The positive $R_{DS(on)}$ temperature coefficient is an advantageous feature when paralleling the MOSFETs. As the sense FET is in parallel with the main FET, even with unbalanced current distribution, the thermal stability may be ensured.

The drain-source on-resistance $R_{DS(on)}$ in a vertical MOSFET as explained above is a function of semiconductor material, channel size, operating condition (drain current and voltage) and strongly depends on junction temperature. when other factors such as gate-voltage ($V_{GS}$) and drain current ($I_{DS}$) are held constant, the direct relation of on-resistance $R_{DS(on)}$ with the junction temperature ($T_j$) in FIG. 1B can be utilized to directly detect the temperature rise during any normal operation or fault condition in comparison to a calibrated $R_{DS(on)}$ in a known temperature (e.g., at 25° C. ambient).

Figure 2A:
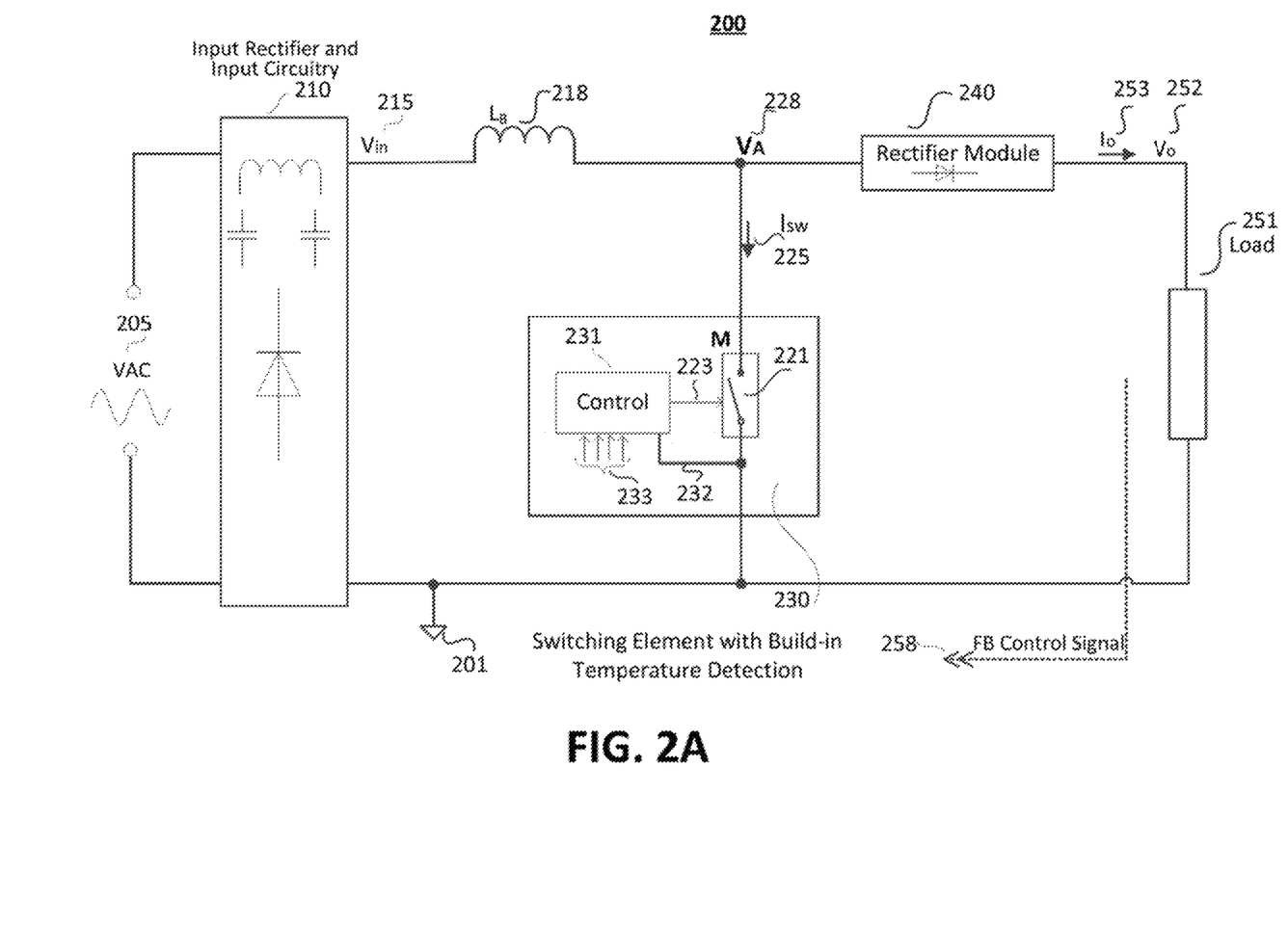
FIGS. 2A and 2B are example power converter circuit diagrams that may advantageously utilize temperature detection and over temperature protection.
Figure 2B:
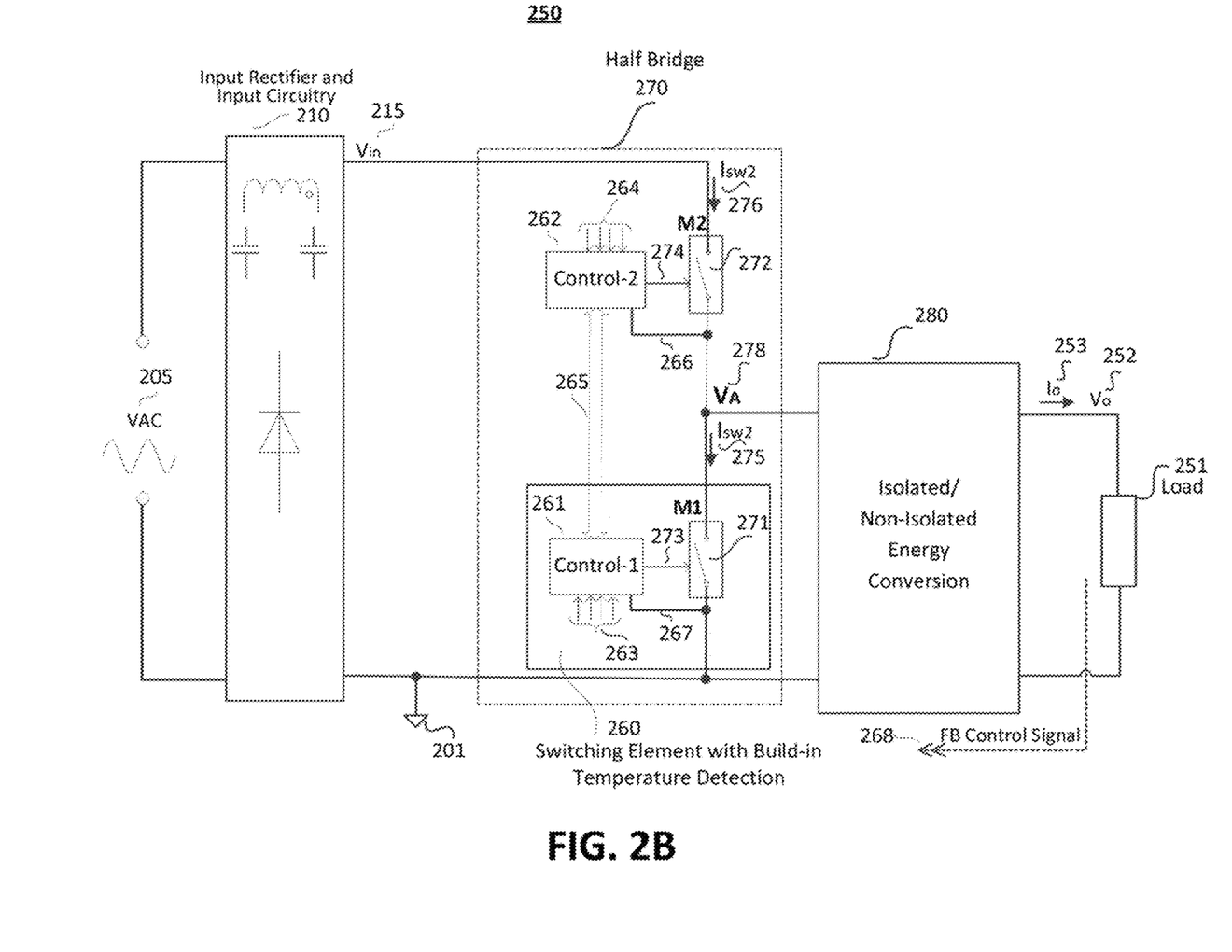

FIG. 2A and FIG. 2B are examples of power converter topologies which include switching device that may benefit from temperature detection and over temperature protection through $R_{DS(on)}$ monitoring according to the embodiments disclosed. FIG. 2A shows an AC/DC boost Power Factor Correction (PFC) converter 200 with a switching device M 221 with control 231 that is referenced to low-side ground reference 201. Control block 231 receives some control signals 233 including a feedback (FB) control signal and generates drive signal 223 to control switching of the switching device and regulate transfer of energy to the output load 251 through the output voltage $V_O$ 252 and output current $I_O$ 258 of the power converter. In one example, the power converter input terminals may be coupled to a sinusoidal input signal $V_{AC}$ 205, which may be rectified and filtered through a rectifier and input circuitry 210 to apply an input voltage signal $V_{in}$ 215 to the boost components. The main boost components include boost inductor $L_B$ 218, boost switching device 221 plus the control block 231, which, in one embodiment, are both integrated in a single IC 230, wherein the temperature detection circuitry disclosed herein may be incorporated into control block 231.

Persons of skill in the art will note that the chopped voltage across switching device 221 is rectified through the rectifier module 240, thereby generating the regulated output voltage $V_o$ 252 and output current $I_o$ 253 to the load 250.

FIG. 2B is another example topology of a half-bridge switching device 270 that may benefit from temperature detection circuitry of the present disclosure added to either the low-side control block 261 or high-side control block 262. The power converter shown in FIG. 2B receives the rectified and electromagnetic interference (EMI) filtered input voltage signal $V_{in}$ 215 from the input rectifier and input circuitry block 210, which is applied across the half-bridge switching device 260. As shown, switching device 260 includes a low-side switch M1 271 with low-side control block, 261, which, through link 277 is referenced to the low potential side (e.g., source) of switch M1 271, and high-side switch M2 272 with high-side control block, 262, which, through link 276 is referenced to the low potential side (e.g., source) of switch M2 272. The low-side control block 261 and high-side control block 262 each may receive extra control signals 263 and 264, respectively. Control signals 263 and 264 may include the feedback FB control signal 268 from the output of the converter. Control blocks 261 and 262 generate drive signals 273 and 274 for low-side and high-side switches 271 and 272, respectively. Low-side control block 261 and high-side control block 262 may be functionally synchronized through communication link 265.

In one embodiment, mid-point potential $V_A$ 278 of half-bridge switching device 270 is coupled to an energy conversion block 280 (which may be of an isolated or non-isolated configuration) that produces/generates output voltage $V_o$ 252 and output current $I_o$ 253 across the load 250.

It is appreciated that the thermal detection circuitry disclosed herein may be added to low-side control block 231 of FIG. 2A or to the low-side control block 261, or high-side control block 262 of FIG. 2B. It should be further understood that the disclosed embodiments are not limited to the example topologies of FIGS. 2A and 2B; that is, a variety of different switching converters utilizing a low-side controller and power semiconductor switching device applications may benefit from the temperature detection circuitry disclosed here.

In a half-bridge configuration, for instance, there is a low-side MOSFET switch and a high-side MOSFET switch. It should be understood that the temperature detection method described herein could be used with either of these MOSFET switches, for example, if they are floating at a non-zero potential. As discussed above, it should be understood that in the case of a MOSFET switch, control is referenced to the source (or non-substrate) of the MOSFET. Similarly for high-side switch M2 272 and control block 262, it is understood that for a MOSFET switch control is referenced to the source (or non-substrate) of the MOSFET. Thus, in both cases, they may be referred to as the MOSFET Source referenced control.

In one embodiment, the $R_{DS(on)}$ of a power MOSFET switching device has a defined positive temperature coefficient. With constant $V_{GS}$ and $I_{DS}$ conditions, by measuring the drain-source on-resistance during operational switching condition at an unknown temperature $R_{DS(on)Tx}$ and comparing it to a stored calibrated value at a known temperature (e.g., 25° C.) $R_{DS(on)T25}$ for the same device under the same conditions/parameters, it is possible to accurately and quickly infer the temperature inside the MOSFET relative to the calibrated temperature.

In one embodiment, the drain-source on-resistance value of a MOSFET device is measured during manufacturing test at a known temperature (e.g., 25° C.) $R_{DS(on)T25}$ and is stored during calibration. Thus, if $R_{DS(on)}$ changes with temperature rise during normal or transient operation, the controller can measure the ratio of instantaneous resistance change versus the calibrated value and calculate the temperature rise, which is useful for thermal protection of the MOSFET device.

In one implementation the drain voltage and current of the power MOSFET switching device is measured in each switching cycle. In one example, drain voltage is measured using a junction field-effect transistor (JFET) that has its drain connected to the drain of the power MOSFET, with the gate of the JFET connected to the source of the power MOSFET. When power MOSFET is on the JFET source, node voltage value follows that of the MOSFET drain, thereby providing an accurate reading of the drain voltage during on-time.

In one embodiment, the MOSFET drain current is obtained through a sense-FET which measures a predetermined fraction of current flowing in the main power MOSFET. Detecting the sense current therefore provides a measure of the power MOSFET drain current ($I_{DS}$) in each switching cycle. Thus, utilizing signals representing drain voltage and drain current of the power MOSFET switching device, it can be determined when the $R_{DS(on)}$ value has exceeded a certain threshold operating value, which, in turn, is directly related to a predefined target temperature limit for the switching power MOSFET.

Figure 3:
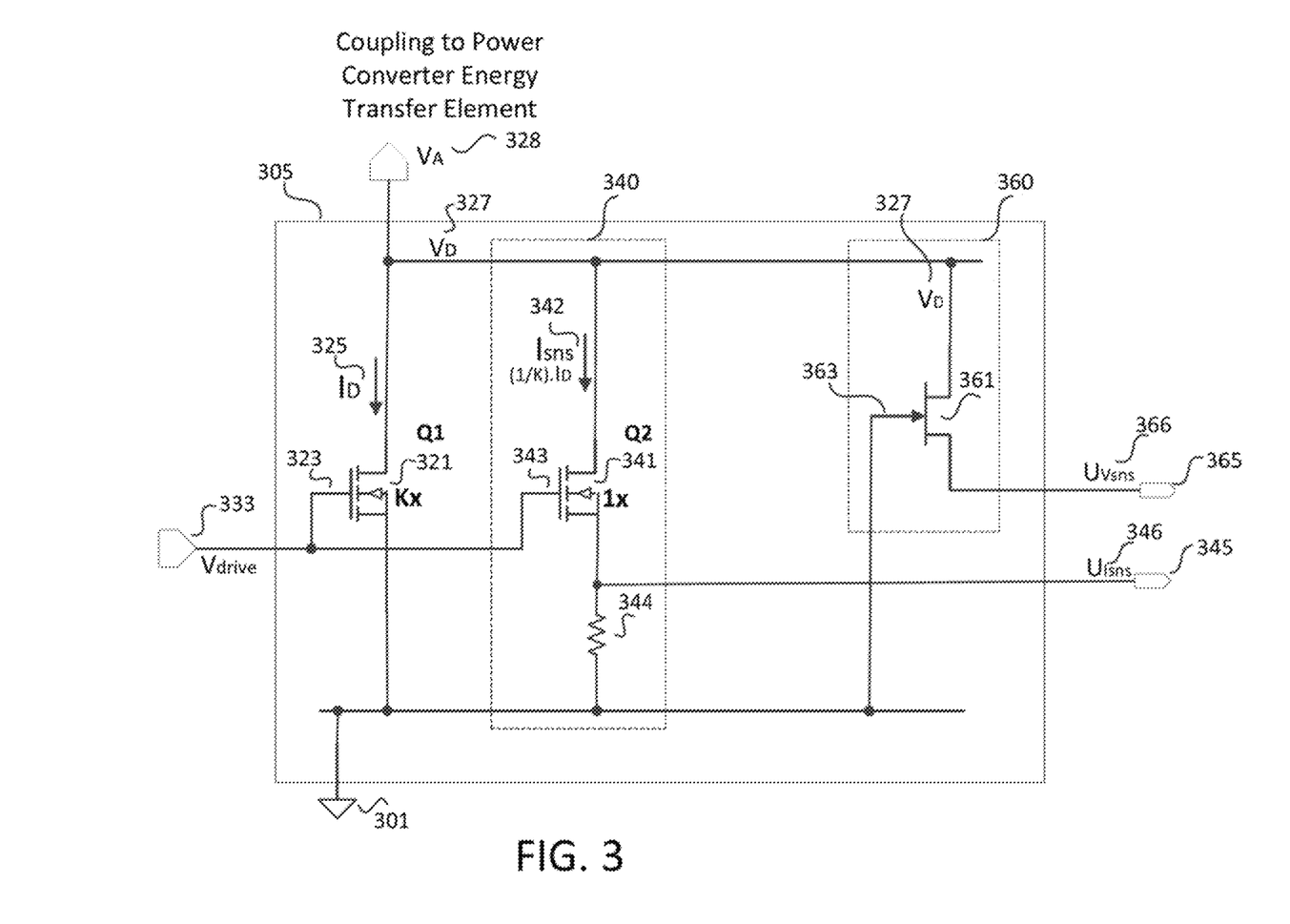
FIG. 3 is an example circuit schematic diagram for sensing instantaneous values of a power MOSFET drain current and drain voltage.

FIG. 3 illustrates an example circuit schematic diagram for sensing instantaneous values of a power MOSFET Q1 321 switching device with drain current $I_D$ 325 and gate signal 323. In one embodiment, power MOSFET Q1 321 is implemented on a silicon substrate. In circuit 305 drain current is sensed by output signal $U_{Isns}$ 346 through a sense-FET Q2 341. Drain voltage is sensed by output signal $U_{Vsns}$ 366 through a JFET 361. As shown, node $V_A$ 328 is the coupling point to a power converter energy transfer element, which corresponds (i.e., is equivalent) to nodes $V_A$ 228 in FIG. 2A and $V_A$ 278 in FIG. 2B. Circuit 305 includes a semiconductor switching device (a main power MOSFET) Q1 321 and a fractional-sized sense-FET Q2 341. Note that the respective size difference between main MOSFET Q1 321 and sense-FET 341 is given by the ratio K:1. The size ratio may be defined by the number of cells in each FET, which, in turn, has a reverse relation to the drain-source on-resistance, and is in direct relation (proportional) to the current in each FET, as shown by the following equations:

$$K = N_{Q1\text{-}cells}/N_{Q2\text{-}cells} = R_{DS(on)Q2}/R_{DS(on)Q1} = I_1/I_2;$$

$$I_2 = I_{sns} = (1/K)I_1;$$

$$V_D = I_1 R_{DS(on)Q1} = I_2 R_{DS(on)Q2} = (I_1/K) R_{DS(on)Q2}.$$

As shown, the drain of main MOSFET Q1 321 and the drain of sense-FET Q2 341 are coupled to the same bus voltage $V_D$ 327. The gating signal 323 for main MOSFET Q1 321 and the gating signal 343 for sense-FET Q2 341 are provided by the same drive signal $V_{drive}$ 333. This satisfies conditions for maintaining constant $V_{GS}$ for both the sense-FET and the main MOSFET. Consequently, the current density in main MOSFET Q1 321 and sense-FET Q2 341 remains the same. The current ratio of $I_D$ 325 flowing through main MOSFET Q1 321 and $I_{sns}$ 342 flowing through sense-FET Q2 341 is proportional to their size K:1. It is appreciated that the drain-source resistance measurement of sense-FET Q2 341 is more accurate (less error) compared to main MOSFET Q1 321 due to its larger drain-source on-resistance.

A sense resistor 344 is shown coupled from the source of sense-FET Q2 341 to ground 301. The sense current $I_{sns}$ 342 flowing through sense resistor 344 generates signal $U_{I_{sns}}$ 346, which is a representation of the current 1325 flowing through main MOSFET Q1 321.

In the embodiment of FIG. 3 drain voltage $V_D$ 327 is sensed through a JFET 361 coupled to drain bus $V_D$ 327. Gate 363 of JFET 361 is coupled to the source of main MOSFET Q1 321. The gate of JFET 361 is shown connected to ground potential (zero voltage). Whenever main MOSFET Q1 321 turns on the gate-source voltage of JFET 361 becomes near zero, and is higher than the pinch-off voltage ($V_P$) of JFET 361. Thus, JFET 361 is also turned on, which couples the drain voltage $V_D$ 327 to a tap terminal (JFET source) 365 for sensing the drain on-voltage drop by signal $U_{Vsns}$ 366. When main MOSFET Q1 321 is off the gate 363 of JFET 361 goes below the pinch-off voltage ($V_P$) of JFET 361. Thus, JFET 361 is in an off state, thereby blocking the drain voltage $V_D$ 327 from the tap terminal 365. Thus, practitioners in the art will appreciate that the on-time instantaneous current, and the on-time instantaneous voltage drop across the drain-source resistance of the power MOSFET are provided via signals $U_{Isns}$ 346 and $U_{Vsns}$ 366.

Figure 4A:
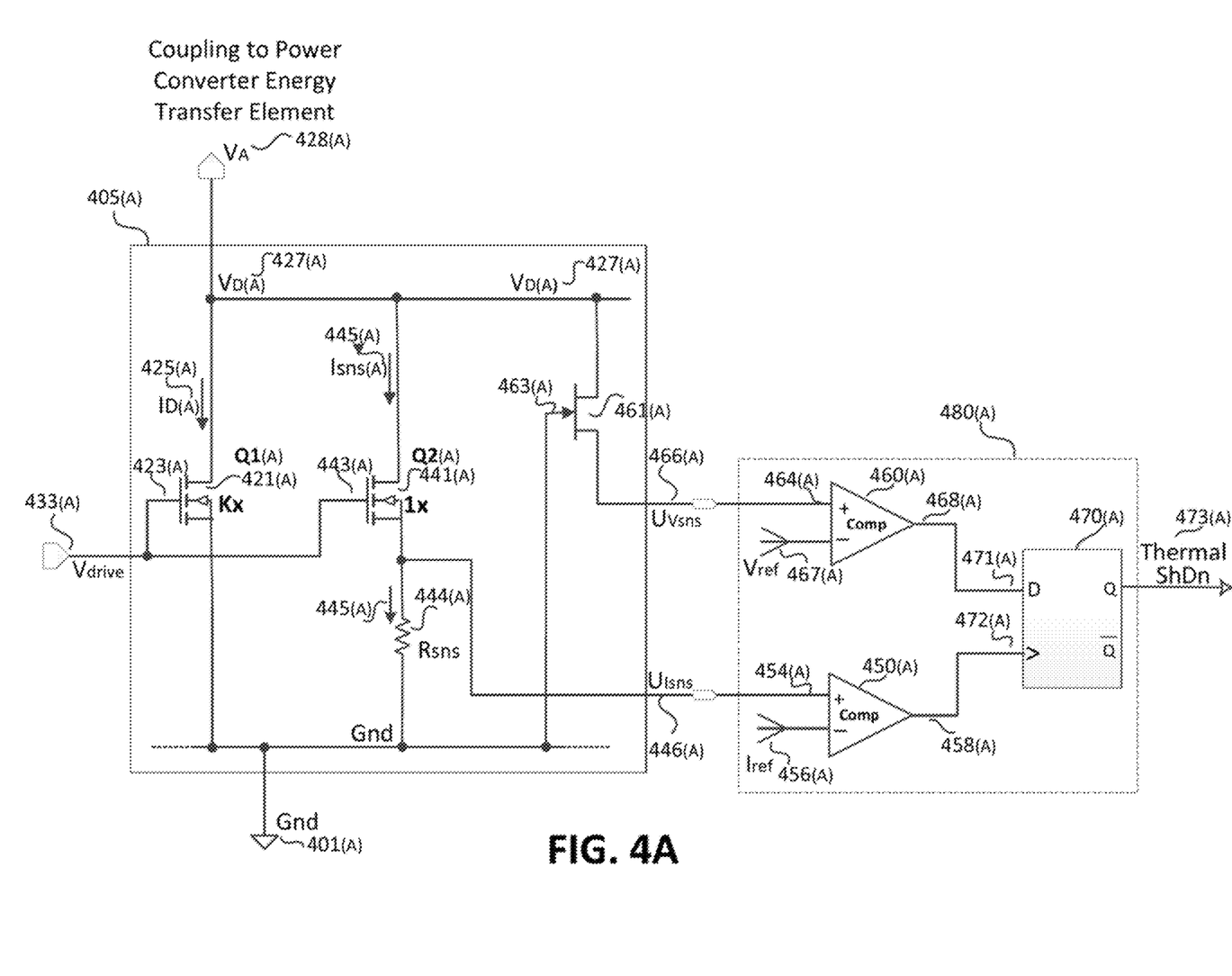
FIG. 4A is an example circuit schematic diagram that utilizes the circuitry of FIG. 3 to detect temperature.

FIG. 4A is an example circuit schematic diagram of a threshold detection circuit 480(A) that may utilize the circuitry of FIG. 3 for fast detection of temperature that exceeds a predefined limit. Circuit block 405(A) in FIG. 4A represents circuitry 305 described in FIG. 3, with all devices and components shown in circuit block 405(A) being counterparts of the corresponding components and devices shown in FIG. 3. Description of the circuit operation and functionality of devices in block 405(A) is the same as that explained in FIG. 3.

As shown, output signals $U_{Isns}$ 446(A) and $U_{Vsns}$ 466(A) are provided as inputs to threshold detection circuit 480(A). Detection circuit 480(A) includes a first comparator 450(A) which receives current signal $U_{Isns}$ 446(A) at its positive input 454(A). Current signal $U_{Isns}$ 446(A) is compared to a reference current signal $I_{ref}$ 456(A) applied to the negative input of comparator 450(A). Whenever signal $U_{Isns}$ 446(A) rises higher than current reference signal $I_{ref}$ 456(A), output 458(A) of comparator 450(A) transitions to a logic high value. In one embodiment, reference current signal $I_{ref}$ 456(A) is a predefined calibration current threshold. Whenever current signal $U_{Isns}$ 446(A) exceeds the predefined calibration current threshold. output 458(A) of comparator 450(A) transitions high.

Detection circuit 480(A) also includes a second comparator 460(A) having a positive input 464(A) coupled to receive signal $U_{Vsns}$ 466(A). Signal $U_{Vsns}$ 466(A) is compared to a reference voltage $V_{ref}$ 467(A) applied to the negative input of comparator 460(A). The reference $V_{ref}$ 467(A) represents a threshold value for the $R_{DS(on)}$ of the power MOSFET Q1 421(A) that is directly related to its junction temperature. Whenever signal $U_{Vsns}$ 466(A) goes higher than the reference voltage $V_{ref}$ 467(A) output 468(A) of the comparator 460(A) transitions to a high logic value.

Output 468(A) of comparator 460(A) is coupled to data input D 471(A) of a D-type flip-flop 470(A). Similarly, output 458(A) of comparator 450(A) is coupled to the clock input 472(A) of D-type flip-flop 470(A). The output of comparator 460(A) transitions to, a logic high value when the drain voltage exceeds the reference voltage threshold, which has been set to indicate that $R_{DS(on)}$ at calibrated current has exceeded a predefined/prescribed threshold value of the drain voltage as an indicator of the temperature limit.

Continuing with the example of FIG. 4A, the output of comparator 450(A) is shown coupled to the clock input of D-type ("D") flip-flop 470(A). Thus, flip-flop 470(A) is clocked by the output from current comparator 450(A). D flip-flop 470(A) captures the value of the D input 471(A) at a definite portion of the clock cycle (such as the rising edge of the clock). That captured value becomes the Q output 473(A). At other times, output 473(A) does not change. The D input 471(A) is output 468(A) from drain voltage comparator 460(A). As a result, Q output 473(A) transitions to a logic high value if the drain voltage provided by signal 466(A) exceeds voltage threshold 467(A) at the instant when current signal 446(A) exceeds the current calibration threshold 456(A). As a result, practitioners in the art will appreciate that Q output 473(A) of D flip-flop 470(A) is set to a logic high value when $R_{DS(on)}$ of the power MOSFET exceeds a combined threshold. In other words, the $R_{DS(on)}$ of the power MOSFET switching device is measured or detected at the moment when the current flowing through the power MOSFET has reached or exceeded the calibration threshold.

As discussed previously, the drain-source resistance $R_{DS(on)}$ of the power MOSFET is a direct function of its junction temperature; therefore changes $R_{DS(on)}$ directly indicates the instantaneous temperature change of the power MOSFET device. In this manner, a logic high value at Q output 473(A) may be used to indicate an alarm condition wherein a recommended or prescribed thermal threshold of the power MOSFET switching device is exceeded.

Figure 4B:
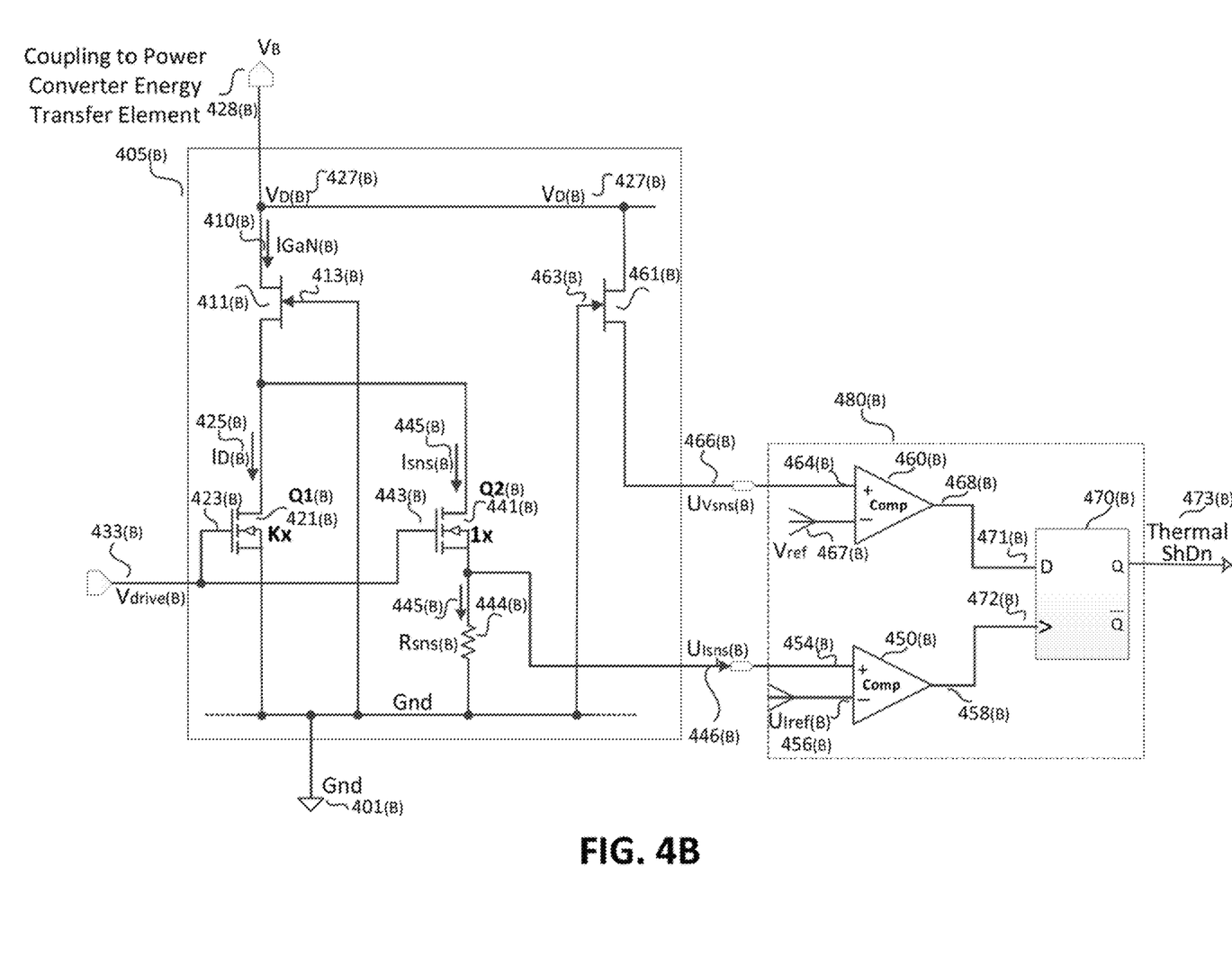
FIG. 4B is an example circuit schematic diagram that utilizes the circuitry of FIG. 3 for transient high temperature detection for applications using a GaN High Electron Mobility Transistor (HEMT) device.

FIG. 4B is an example circuit schematic diagram that utilizes the circuitry of FIG. 3 for fast detection of temperature that exceeds a predefined limit for applications using a GaN device. As shown, the GaN HEMT 411(B) typically operates in a cascade configuration. GaN HEMT 411(B) commonly has a lower loss as compared to a silicon switching device. However, in one example it is used on a sapphire substrate that has high thermal impedance it can be difficult to efficiently remove the heat generated by the GaN HEMT 411(B). As a consequence, temperature rise may become an issue. To maximize the power processing capability and reliable operation of a GaN device it is preferable to operate the GaN device below its safe maximum device temperature.

It is appreciated that due to the high thermal impedance of the separate sapphire substrate of the GaN HEMT, the temperature of the GaN HEMT device cannot be measured accurately by proximate controllers. In contrast, the electronic circuit shown in FIG. 4B may be advantageously utilized to accurately measure device temperature, by implementing a thermal comparator for cascaded GaN HEMT 411(B).

Persons of skill will understand that the circuit of FIG. 4B with cascaded GaN HEMT 411(B) has a deterministic positive temperature coefficient. Knowing the temperature coefficient for each transistor device makes it possible to determine the temperature rise of the device above the room temperature, and at one or more test current thresholds (single or multi-points of measurement). It is appreciated that test current is typically a current periodically reached during normal operation of the device.

With reference to FIG. 4B, MOSFETs Q1(B) 421(B) and Q2(B) 441(B) are low-side MOSFETs. MOSFET Q1(B)

421(B) is a main MOSFET whereas MOSFET Q2(B) 441 (B) is a sense FET whose dimensions are in a fixed small ratio; (1/K) to that of main MOSFET Q1(B) 421(B). MOSFET Q2(B) 441(B) therefore provides a current that is, a small fixed ratio (1/K) with respect to the current flowing in main MOSFET Q1(B) 421(B). The sum of the two currents $I_{D(B)}$ 425(B) and $I_{sns(B)}$ 445(B) flowing in Q1(B) 421(B) and Q2(B) 441(B), respectively, is the current $I_{GaN(B)}$ that flows through the drain-source of cascaded GaN HEMT 411(B). Note that GaN HEMT 411(B) is shown having its gate terminal 413(B) coupled to ground 401(B). As configured the drain current $I_{sns(B)}$ 445(B) of sense FET Q2(B) 441(B) is a fixed small ratio (K) of the current $I_{GaN(B)}$ flowing through the drain-source of GaN HEMT 411(B).

Sense current $I_{sns(B)}$ 445(B) flowing through Q2(B) 441 (B) is converted to a voltage via the voltage drop across resistor $R_{sns(B)}$ 446(B) such that voltage signal $U_{Isns(B)}$, 446(B) is compared to a reference signal $U_{Iref(B)}$ 456(B). Reference signal $U_{Iref(B)}$ 456(B) sets the test current where the temperature comparison is made. It is appreciated that in another embodiment the sense current $I_{sns(B)}$, 445(B) flowing through transistor Q2(B) 441(B) may be directly compared to a reference current.

Continuing with the example circuit of FIG. 4B, the output signal 458(B), which results from the comparison of sensed current signal $U_{Isns(B)}$ 454(B) and reference current signal $U_{Iref(B)}$ 456(B) through comparator 450(B), generates a clock pulse signal 472(B) at the clock input of D flip-flop 470(B). Clock pulse signal 472(B) triggers D-type flip-flop 470(B), resulting in the input signal 471(B) becoming latched on the Q output, i.e., thermal shutdown signal 473(B). D input signal 471(B) is provided at the output 468(B) of comparator 460(B). Output 468(B) of comparator 460(B) is produced by comparing signal 464(B) (voltage signal $U_{Vsns(B)}$, 466(B)) with voltage reference $V_{ref}$ 467(B).

A second JFET 461(B) is shown having its drain coupled to the drain of GaN HEMT 411(B). The source of JFET 461(B) is coupled to drain voltage link $V_{D(B)}$ 427(B), with its gate 463(B) being coupled to ground 401(13), In one example shown, JFET 461(B) may comprise a silicon JFET on the controller, or any other suitable type of JFET, or other transistor with similar function. The circuity shown in FIG. 4B thus accurately detects if GaN HEMT 411(B) exceeds a target temperature, by detecting the voltage $V_{D(B)}$ 427(B) present at the drain of GaN HEMT 411(B) at a specific test current. Note that the voltage $V_{D(B)}$ 427(B) is coupled through JFET 461(B) where it appears at the positive input 464(B) of comparator 460(B). At the specific test current when the voltage exceeds the threshold voltage, indicating the target temperature of the as defined by $V_{ref}$ 467(B) is exceeded, the output 468(B) transitions to a high logic level.

It should be understood that in other embodiments more than one threshold level may be detected. That is, multiple threshold voltage levels may be defined for various types of temperature detection or other types of control protection. Multiple sets of comparators and flip-flops may be utilized to generate the various output signals for temperature detection and/or control protection. By way of example, a first protection level may be used to change one or more control parameters of the power MOSFET switching device (e.g., a current limit, a switching frequency, a pulse width, or to temporary halt switching) A second protection level may be, used to prevent the case of a fatal transient or temperature rise, with an alarm signal being use to latch up or permanently shut down the device.

Persons of skill in the art will understand, that the disclosed subject matter may be implemented by different versions and varieties of semiconductor materials. For instance, the power MOSFET switching device may consist of any discrete or integrated Si, SiC, GaN or other types of high electron mobility semiconductor switches.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example currents, voltages, resistances, device types and sizes, etc., are provided for explanation purposes and that other values may also be employed in other embodiments and examples in accordance with the teachings of the present invention.

I claim:

1. An electronic circuit for detecting a temperature rise in a power transistor device, the temperature rise caused by a current flow in the power transistor device, the electronic circuit comprising:
   a sense-field-effect transistor (sense-FET), the sense-FET sensing a fractional portion of the current flow and outputting a current signal at a first node;
   a normally-on switching transistor device, a drain of the normally-on switching transistor device being coupled to a drain of the power transistor device, a gate of the normally-on switching transistor device being connected to a source of the power transistor device, such that when the power transistor device is turned on, the normally-on switching transistor device is also turned on, and a drain voltage signal of the power transistor device is output at a second node; and
   a detection circuit coupled to receive the drain voltage signal and the current signal, the detection circuit outputting an alarm signal when the drain voltage signal exceeds a reference voltage signal and the current signal exceeds a reference current signal, which indicates that a drain-source resistance of the power transistor device exceeds a combined threshold limit.

2. The electronic circuit of claim 1 wherein the power transistor device comprises a GaN high electron mobility junction field-effect transistor (HEMT) cascaded with a Si power MOSFET, the drain of the GaN HEMT being coupled to the drain of the normally-on switching transistor device.

3. The electronic circuit of claim 2 wherein the normally-on switching transistor device comprises a junction field-effect transistor (JFET).

4. The electronic circuit of claim 3 wherein the gate of the JFET is coupled to the source of the Si power MOSFET.

5. The electronic circuit of claim 4 wherein the gate of the JFET and the source of the Si power MOSFET are both connected to a ground potential.

6. The electronic circuit of claim 1 wherein the alarm signal indicates that the temperature rise exceeds a thermal threshold of the power transistor device.

7. The electronic circuit of claim 2 wherein the GaN HEMT is disposed on a first semiconductor die and the Si power MOSFET is disposed on a second semiconductor die.

8. The electronic circuit of claim 7 wherein the first semiconductor die comprises sapphire and the second semiconductor die comprises silicon.

9. The electronic circuit of claim 1 wherein the reference current signal is set to a value at which point the current flow in the power transistor device has reached a calibration current threshold.

10. The electronic circuit of claim 2 wherein the reference current signal is set to a value at which point the current flow in the power transistor device has reached a calibration current threshold.

11. The electronic circuit of claim 1 wherein the reference voltage signal is set to a value at which point the drain-source resistance has reached a calibration threshold value of the drain voltage signal indicative of temperature limit of the power transistor device.

12. The electronic circuit of claim 2 wherein the reference voltage signal is set to a value at which point the drain-source resistance has reached a calibration threshold value of the drain voltage signal indicative of temperature limit of the power transistor device.

13. The electronic circuit of claim 1 wherein the detection circuit comprises:
   a first comparator having a first input coupled to receive the drain voltage signal, and a second input coupled to receive the reference voltage signal, the first comparator outputting a first logic signal when the drain voltage signal exceeds the reference voltage signal; and
   a second comparator having a first input coupled to receive the current signal, and a second input coupled to receive the reference current signal, the second comparator outputting a second logic signal when the current signal exceeds the reference current signal.

14. The electronic circuit of claim 2 wherein the detection circuit comprises:
   a first comparator having a first input coupled to receive the drain voltage signal, and a second input coupled to receive the reference voltage signal, the first comparator outputting a first logic signal when the drain voltage signal exceeds the reference voltage signal; and
   a second comparator having a first input coupled to receive the current signal, and a second input coupled to receive the reference current signal, the second comparator outputting a second logic signal when the current signal exceeds the reference current signal.

15. The electronic circuit of claim 13 wherein the detection circuit further comprises a flip-flop having an input coupled to receive the first logic signal, a clock input coupled to receive the second logic signal, the flip-flop outputting the alarm signal responsive to the first and second logic signals.

16. The electronic circuit of claim 14 wherein the detection circuit further comprises a flip-flop having an input coupled to receive the first logic signal, a clock input coupled to receive the second logic signal, the flip-flop outputting the alarm signal responsive to the first and second logic signals.

17. The electronic circuit of claim 15 wherein the flip-flop is a D-type flip-flop.

18. The electronic circuit of claim 16 wherein the flip-flop is a D-type flip-flop.

19. The electronic circuit of claim 1 further comprising a sense resistor coupled between the first node and a ground potential.

20. The electronic circuit of claim 2 further comprising a sense resistor coupled between the first node and a ground potential.

21. The electronic circuit of claim 1 wherein the first node comprises the source of the sense-FET and the second node is the source of the normally-on switching transistor device.

22. The electronic circuit of claim 2 wherein the first node comprises the source of the sense-FET and the second node is the source of the normally-on switching transistor device.

23. The electronic circuit of claim 1 wherein the gate of the normally-on switching transistor device and the source of the power transistor device are both connected to a ground potential.

24. The electronic circuit of claim 1 wherein the drain of the power transistor device is coupled to a power converter energy transfer element.

25. The electronic circuit of claim 1 wherein the alarm signal is used to turn off the power transistor device.

26. The electronic circuit of claim 2 wherein the alarm signal is used to turn off the power transistor device.

27. The electronic circuit of claim 1 wherein the detection circuit receives the voltage signal and the current signal at a predetermined gate-source voltage, and a predetermined current flow in the power transistor device.

28. The electronic circuit of claim 2 wherein the detection circuit receives the voltage signal and the current signal at a predetermined gate-source voltage, and a predetermined current flow in the power transistor device.

* * * * *